(12) United States Patent
Iwasaki et al.

(10) Patent No.: US 8,164,090 B2
(45) Date of Patent: Apr. 24, 2012

(54) FIELD EFFECT TRANSISTOR AND PROCESS FOR PRODUCTION THEREOF

(75) Inventors: Tatsuya Iwasaki, Machida (JP); Naho Itagaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 187 days.

(21) Appl. No.: 12/573,381

(22) Filed: Oct. 5, 2009

(65) Prior Publication Data

US 2010/0084655 A1    Apr. 8, 2010

(30) Foreign Application Priority Data

Oct. 8, 2008 (JP) ................................. 2008-261878

(51) Int. Cl.
*H01L 29/72* (2006.01)

(52) U.S. Cl. .............................. 257/43; 257/66; 257/741

(58) Field of Classification Search ................... 257/43, 257/66, 741
See application file for complete search history.

(56) References Cited

U.S. PATENT DOCUMENTS

| | | | |
|---|---|---|---|
| 7,601,984 B2 | 10/2009 | Sano et al. | |
| 2005/0059227 A1 | 3/2005 | Chen et al. | 438/586 |
| 2006/0108636 A1 | 5/2006 | Sano et al. | 257/347 |
| 2006/0113549 A1 | 6/2006 | Den et al. | 257/79 |
| 2007/0002251 A1* | 1/2007 | Chang et al. | 349/141 |
| 2007/0108446 A1 | 5/2007 | Akimoto | 257/61 |
| 2007/0194379 A1 | 8/2007 | Hosono et al. | 257/347 |
| 2009/0072232 A1 | 3/2009 | Hayashii et al. | 257/43 |
| 2009/0072233 A1 | 3/2009 | Hayashi et al. | 257/43 |
| 2009/0179199 A1 | 7/2009 | Sano et al. | |
| 2009/0186437 A1 | 7/2009 | Akimoto | |
| 2009/0189155 A1 | 7/2009 | Akimoto | |
| 2009/0189156 A1 | 7/2009 | Akimoto | |
| 2009/0305461 A1* | 12/2009 | Akimoto et al. | 438/104 |
| 2010/0003783 A1 | 1/2010 | Akimoto | |
| 2010/0038639 A1 | 2/2010 | Akimoto | |
| 2010/0109002 A1 | 5/2010 | Itagaki et al. | |
| 2010/0136743 A1 | 6/2010 | Akimoto et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |

FOREIGN PATENT DOCUMENTS

| | | |
|---|---|---|
| EP | 1 770 788 A2 | 4/2007 |
| JP | 2007-150158 | 6/2007 |
| JP | 2008-112909 | 5/2008 |
| WO | WO 2008/126884 A1 | 10/2008 |
| WO | WO 2008/133345 A1 | 11/2008 |

OTHER PUBLICATIONS

European Office Action issued in corresponding application No. 09012657.4 dated Jun. 20, 2011—4 pages.

K. Nomura et al., "Room-Temperature fabrication of transparent flexible thin-film transistors using amorphous oxide semiconductors," Letters to nature, vol. 432, pp. 488-492, Nov. 25, 2004.

(Continued)

*Primary Examiner* — Edward Wojciechowicz
(74) *Attorney, Agent, or Firm* — Fitzpatrick, Cella, Harper & Scinto (57) ABSTRACT

A field effect transistor has a gate electrode, gate-insulating layer, a channel and a source and drain electrodes connected electrically to the channel, the channel comprising an oxide semiconductor, the source electrode or the drain electrode comprising an oxynitride.

6 Claims, 6 Drawing Sheets

OTHER PUBLICATIONS

Y. Shimura et al., "Specific contact resistances between amorphous oxide semiconductor IN-Ga-Zn-O and metallic electrodes," *Thin Solid Films*, vol. 516, pp. 5899-5902, 2008.

K. Ip et al., "Contacts to ZnO," Journal of Crystal Growth, vol. 287, pp. 149-156, 2006.

Chinese Office Action issued by the State Intellectual Property Office of the People's Republic of China dated Dec. 14, 2010 in the corresponding application No. 200910204465.8 and its English-language translation—9 pages.

European Search Report issued in the counterpart application No. 09012657.4 dated Jan. 14, 2010—7 pages.

\* cited by examiner

FIELD EFFECT TRANSISTOR AND PROCESS FOR PRODUCTION THEREOF

BACKGROUND OF THE INVENTION

1. Field of the Invention

The present invention relates to a field effect transistor employing a semiconductor film composed of an oxide as the channel. The present invention relates also to a process for producing the transistor.

2. Description of the Related Art

The field effect transistor (FFT) is a three-terminal element comprising a gate electrode, a source electrode, and a drain electrode. This FET is an electron-active element for controlling and switching, by application of a voltage to a gate electrode, the current flowing through the channel layer between the source electrode and the drain electrode. In particular, the FET employing a semiconductor thin film as a channel layer is called a thin film transistor (TFT).

The TFT, based on the thin film technique, can readily be formed in a large area on a substrate advantageously. Therefore, the TFTs are widely used as a driving element of a flat panel display like a liquid crystal display. In the liquid crystal display (LCD), the pixels are turned on and off by TFT formed on a glass substrate. For prospective organic LED display (organic light-emitting diode display, OLED) of a high performance, current driving of a pixel by TFT is considered to be effective.

The TFTs employing a polycrystalline silicon film or an amorphous silicon film are widely used as the material for the channel layer at the moment. However, the amorphous silicon TFT or the polysilicon TFT is necessarily processed at a high temperature in the device production, which makes difficult the formation of the thin film on a substrate like a plastic substrate or a film.

Lately, semiconductor materials composed mainly of an oxide are attracting attention as the material for the TFT to be formed on a polymer substrate, a film, or a glass substrate.

For example, TFTs are developed actively which employ a transparent oxide thin film constituted mainly of ZnO (zinc oxide). Further, a thin film transistor is disclosed which employs an In—Ga—Zn—O type of amorphous oxide. Such TFTs are described in documents, for example: U.S. Patent Application Publication No. 2007/0194379 (corresponding to International Publication No. 2005/088726), and Nature, vol. 432, pp. 488-492, (2004). Such a transistor can be formed at a room temperature on a plastic or glass substrate, and has a transistor characteristic of normally-off type at an electric field effect mobility of about 6-9 $cm^2(Vs)^{-1}$.

For satisfactory characteristics of the transistor, the resistance between the semiconductor and the source electrode or the drain electrode is preferably lower, and the electric connection is preferably stabler in the environment or in the driving. For this purpose, electrodes of the amorphous oxide thin film transistor are disclosed which employ oxide electrodes such as ITO ($In_2O_3$:Sn, tin-containing indium oxide), and metal electrodes such as Au (gold) (Thin Solid Films, 516 (2008) 5899).

Various metal electrodes are described for electric connection to a crystalline ZnO semiconductor in a document: Journal of Crystal Growth. 287 (2006) 149.

As the source electrode and the drain electrode of the TFT employing an oxide semiconductor, several kinds of electrodes are described in the above-cited document (Thin Solid Films 516 (2008) 5899). However, further improvements in the electric contact and in the reliability are necessary. A noble metal such as gold does not have sufficient adhesiveness to an oxide semiconductor, and is less reliable in that the metal electrode produced by a productive process like vacuum deposition or sputtering is easy to be peeled off. In contrast, an electrode composed of an oxide like $In_2O_3$:Sn (ITO) is preferred for the adhesiveness. However, the surface property of such an oxide electrode can be affected in the film forming process or the post-treatment including a heat treatment and a solution treatment to cause variation in electric connection with the semiconductor.

An object of the present invention is to provide an electrode which enables stable electric connection to the oxide semiconductor with a lower contact resistance.

On the other hand, amorphous $InGaZnO_4$ has an optical band gap of about 2.9 eV, being transparent to visible light. However, a transistor employing the amorphous $InGaZnO_4$ as the channel can change its characteristic on exposure to near-ultraviolet light having a wavelength of shorter than about 450 nm (higher than about 2.7 eV). The transistor using such a material vary their characteristics. Display device using the transistor tends to cause deterioration of the image quality on irradiation of a display light or an external light onto the TFT.

To prevent the image quality deterioration, a light-shielding layer may be placed on or under the TFT to intercept the light. This will limit the layout of the TFT and increase the production steps. Further, even with the light-shielding layer, depending on the constitution, a trace amount of stray light can irradiate the TFT, unexpectedly. (The stray light herein signifies the light introduced to the TFT from an unspecified portion by reflection or refraction by inside or outside of the element.) Therefore, the TFT insensitive to the light is desired.

A second object of the present invention is to provide a thin film transistor which has characteristics less affected by irradiation of stray light.

SUMMARY OF THE INVENTION

The present invention is directed to a field effect transistor having a gate electrode, gate-insulating layer, a channel and a source and drain electrodes connected electrically to the channel, the channel comprising an oxide semiconductor, the source electrode or the drain electrode comprising an oxynitride.

In the field effect transistor, a main metallic element of the oxynitride can be zinc (Zn) or indium (In).

The main metallic element contained in the oxide semiconductor and the main metallic element contained in the oxynitride can be the same.

The oxide semiconductor can contain zinc (Zn), indium (In), and oxygen (O), and can have an amorphous structure, and the oxynitride can contain a crystal which contains zinc (Zn), indium (In), oxygen (O), and nitrogen (N).

The compositional ratio of oxygen and nitrogen contained in the oxynitride can be represented by the relational expression (1):

$$\text{(Nitrogen atoms)/(Nitrogen atoms+Oxygen atoms)} \geq 0.01 \quad (1).$$

In the field effect transistor, an optical band gap of the oxynitride can be smaller than an optical band gap of the oxide semiconductor.

The source electrode and the drain electrode can be a source region and a drain region formed by addition of nitrogen to the semiconductor constituting the channel.

The present invention is directed to a process for producing a field effect transistor, comprising the steps of: forming an oxide semiconductor film on a substrate, adding nitrogen to parts of the oxide semiconductor film to form source and drain regions comprised of an oxynitride, and leaving the non-nitrogen-added portion as a channel region.

The process for producing a field effect transistor can comprise the steps of: forming a gate electrode, and forming a source region and a drain region by addition of nitrogen, by use of the gate electrode as a mask, to unmasked regions of the oxide semiconductor film by self-aligning relative to the gate electrode.

The field effect transistor of the present invention employs an oxide semiconductor as the channel layer, and an oxynitride as the source electrode and/or the drain electrode, which stabilizes the electric connection between the channel region and the source electrode and/or drain electrode and improves the uniformity and reliability of the elements.

Further, the electrode constituted of an oxynitride absorbs near-ultraviolet light to prevent penetration of the near-ultraviolet light through the source electrode portion or the drain electrode portion. Thus the constitution of the present invention prevents variation of the TFT characteristics even when stray light is generated within the TFT substrate (substrate on which an array of TFTs is formed), and provides a TFT substrate which has stable characteristics against irradiation of near-ultraviolet light.

Further features of the present invention will become apparent from the following description of exemplary embodiments with reference to the attached drawings.

BRIEF DESCRIPTION OF THE DRAWINGS

FIG. 1A illustrates a top-gate structure. FIG. 1B illustrates a bottom-gate structure.

FIG. 3A, of an In—Ga—Zn—O type; FIG. 3B, of a Zn—In—O type.

FIG. 5A showing the transistor characteristics (Id-Vd characteristics); and FIG. 5B showing the transfer characteristics (Id-Vg characteristics).

DESCRIPTION OF THE EMBODIMENTS

Preferred embodiments of the present invention will now be described in detail in accordance with the accompanying drawings.

Figure 1A:
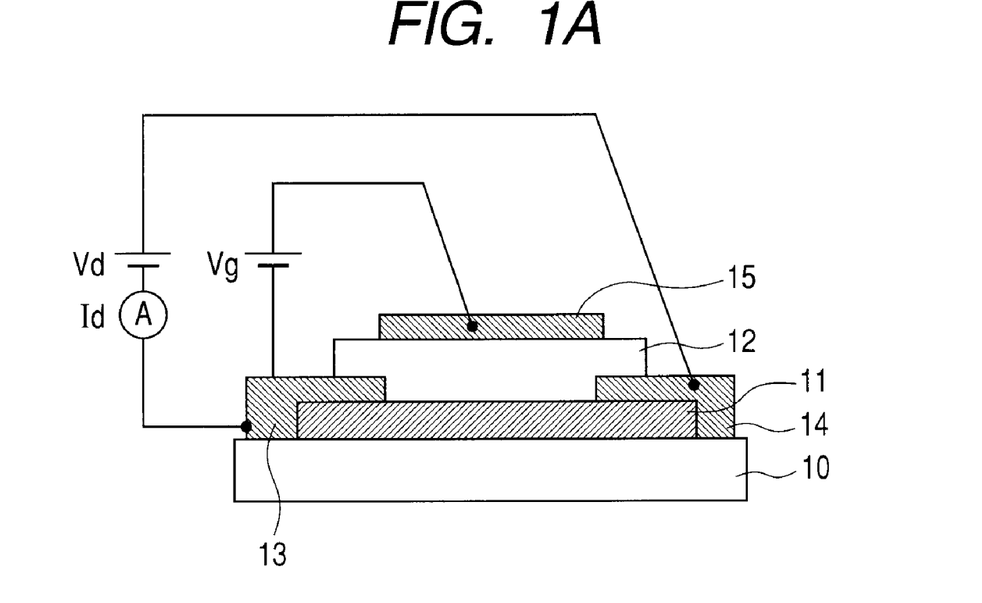
FIGS. 1A and 1B are sectional views of a constitution of the thin film transistor of the present invention.
Figure 1B:
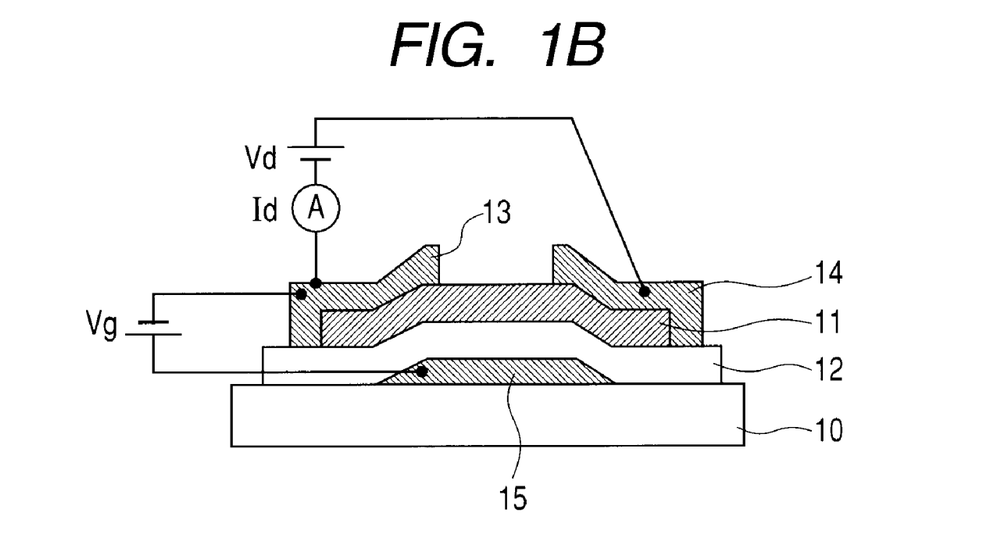
Figure 2:
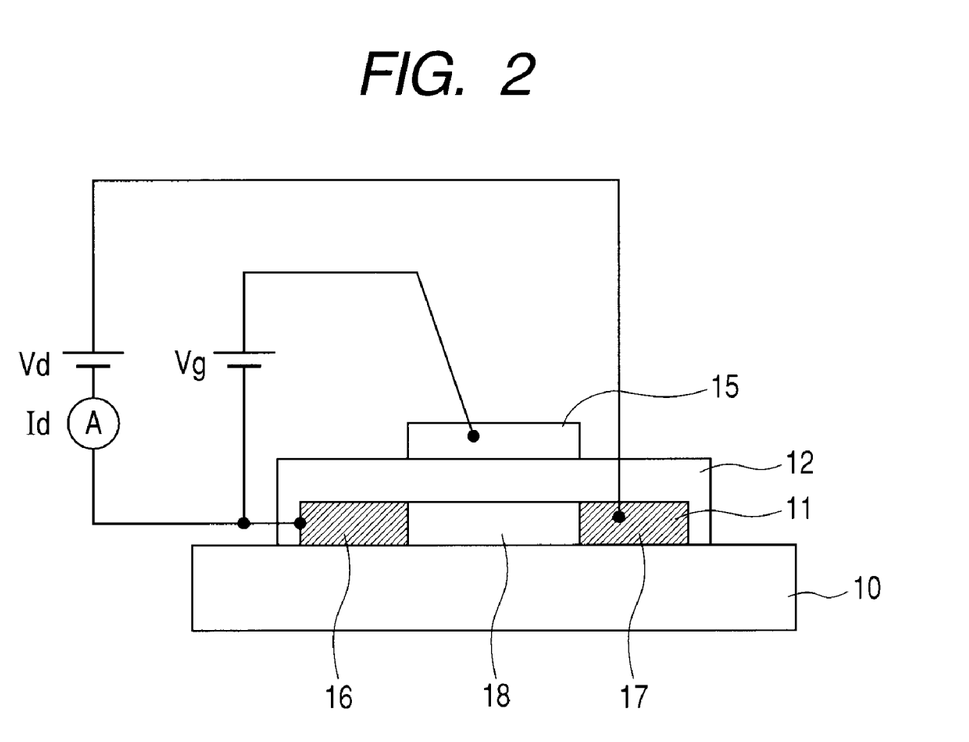
FIG. 2 is a sectional view of a thin film transistor of a coplanar structure of the present invention.

FIGS. 1A and 1B, and FIG. 2 are sectional views illustrating respectively a constitution of the field effect transistor of the present invention. In the drawings, the reference numerals denote the following members: 10, a substrate; 11, a channel layer (oxide semiconductor); 12, a gate-insulating layer (or a gate-insulating film); 13, a source electrode; 14, a drain electrode, and 15, a gate electrode. FIG. 1A illustrates a top-gate structure having gate-insulating layer 12, and gate electrode 15 formed in this order on channel layer 11. FIG. 1B illustrates a bottom-gate structure having gate-insulating layer 12 and semiconductor channel layer 11 formed in this order on gate electrode 15. FIG. 2 illustrates a coplanar structure having channel region 18, source region 16, and drain region 17 placed on the same plane. The present invention is applicable to any of the TFT constitutions including the top-gate structures (normal stagger structures), the bottom-gate structures (inverted stagger structures), and the coplanar structures.

The field effect transistor (FET) employing an oxide semiconductor as the channel of the present invention is characterized by the source electrode 13 and/or drain electrode 14 constituted of a material (oxynitride) containing a metallic element or elements, oxygen, and nitrogen. The inventors of the present invention have found that the electro-conductive film composed of the oxynitride is connectable well electrically to an oxide semiconductor (like InGaZnO4, ZnO, etc.) with high reliability.

The compositional ratio of oxygen and nitrogen in the oxynitride, (nitrogen atoms)/(nitrogen atoms plus oxygen atoms) is preferably not less than 0.01 as mentioned later. However, the compositional ratio of nitrogen and oxygen is not limited thereto.

The concentration of nitrogen, oxygen, and the metal in the oxynitride film can be determined by SIMS (secondary ion mass spectrometry), RBS (Rutherford backscattering spectroscopy), XPS (X-ray photoelectron spectroscopy), XRF (X-ray fluorescence analysis), and a like method.

The metallic element for constituting the oxynitride of the electrode includes Zn (zinc), and In (indium). The oxynitride includes types of In—O—N, Zn—In—O—N, Zn—Ga—O—N, Zn—Ge—O—N, Zn—In—Ga—O—N, In—Sn—O—N, Zn—Sn—O—N, and so forth. Of these, the materials containing Zn as the main metallic element are preferred for obtaining the lower resistivity. In particular, Zn—In—O—N type oxynitride films are preferred for achieving a resistivity, for example, ranging from 1 mΩcm ($1 \times 10^{-3}$ Ωcm) to 10 m Ωcm and the environmental stability. The use of such an oxynitride as the source electrode and/or the drain electrode enables stable electric connection between the channel region and the source electrode, and between the channel region and the drain electrode. The oxynitride may contain an impurity in a small amount not to affect adversely substantially the film characteristics such as electric conductivity and optical band gap.

The main metallic element of the oxynitride electrode and the metallic element of the oxide semiconductor channel layer are preferably the same. The TFT elements having such a constitution have uniform characteristics and are reliable in the electric connection. This is presumably because the use of the same metallic element both in the oxynitride electrode and in the oxide semiconductor channel layer makes the work functions of the electrode and the channel layer to match with each other and gives high adhesiveness. Further, by using the materials with the same kinds of elements for the electrodes and the channel, the durability against the elemental diffusion between their layers under the heat-treatment process and the electrical driving of the TFT is enhanced. For example, a thin film transistor comprising an oxynitride electrode of an In—Ga—Zn—O—N type and an oxide semiconductor of an In—Ga—Zn—O type, and a thin film transistor comprising an oxynitride electrode of a Zn—In—O—N type and an oxide semiconductor of a Zn—In—O type are preferable.

(Absorption Characteristics of Oxynitride Film)

As described above, a thin film transistor employing an oxide semiconductor is affected by near-ultraviolet visible light (light having an energy lower than optical band gap of the oxide semiconductor). Use of a transparent electrode like ITO as the source electrode or the drain electrode can cause penetration of stray light through the electrode into the channel to affect the characteristics of the oxide TFT. On the other hand, in the present invention, use of an oxynitride thin film, which absorbs the near-ultraviolet light, will intercept the penetration of the near-ultraviolet light through the electrode into the channel. A Au electrode or a like metal electrode, although it is capable of decreasing the penetration of stray light by reflection, is not sufficiently reliable in adhesiveness to the oxide semiconductor and in the electric contact, and the reflected light can be introduced to the channel. On the other hand, the oxynitride electrode gives satisfactory electric connection and absorbs the near-ultraviolet light, whereby the variation of the TFT characteristics caused by irradiation with the stray light through the electrode to the channel can be decreased. The near-ultraviolet light, if projected to the oxynitride electrode can hardly affect the electrode performance (resistivity). The TFT having a structure for intercepting the penetration of the stray light through the electrode to the channel can make the panel design against the stray light easier.

Figure 4:
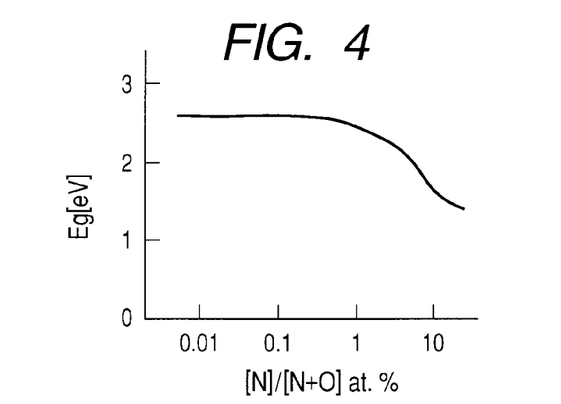
FIG. 4 is a graph of dependence of the optical band gap on the compositional ratio of N/(N+O) of an oxynitride thin film of a Zn—In—O—N type.

The thin film constituted of an oxynitride has a smaller optical band gap at a lager content of the nitrogen in the film to absorb visible light (near-ultraviolet light). FIG. 4 is a graph of dependence of the optical band gap of Zn—In—O—N type oxynitride thin films on the compositional ratio, N/(N+O). In the graph, the symbol N denotes the number of nitrogen atoms, and the symbol O denotes the number of oxygen atoms. In the drawing, at the compositional ratio N/(N+O) of larger than 1% (N/(N+O)=0.01), the optical band gap is smaller to cause absorption of light of the near-ultraviolet region. For example, with a TFT employing an oxide semiconductor channel of Zn—In—O type, variation of the TFT characteristics caused by near-ultraviolet light can be prevented by adjusting the compositional ratio N/(N+O) of the oxynitride electrode of the Zn—In—O—N type to be 0.01 or higher. That is, with a thin film transistor having a source electrode and a drain electrode which are constituted of an oxynitride, the compositional ratio of N/(N+O) is preferably adjusted to be not less than 0.01.

As described above, for the absorption of the light which affects the oxide semiconductor, the optical band gap of the electrode constituted of the oxynitride is preferably smaller than the optical band gap of the oxide semiconductor. For example, amorphous $InGaZnO_4$ has an optical band gap of about 2.9 eV, being transparent to visible light. A transistor employing this amorphous $InGaZnO_4$ as the channel can cause a change in its property on irradiation of near-ultraviolet light of about 2.7 eV or higher. Therefore, the optical band gap of the oxide semiconductor is preferably larger than the optical band gap of the electrode constituted of an oxynitride by 0.2 eV or more, more preferably by 0.5 eV (hereinafter the phrase "having amorphous structure" is simply referred to as "amorphous").

The optical band gap can be estimated from the light absorption edge of the transmission spectrum of the thin film measured by spectrometry. In the present invention, the light absorption coefficient is measured by scanning from 800 nm toward the shorter wavelength side, and the wavelength where the light absorption coefficient becomes $10^4$ (1/cm) or higher is defined to be the light absorption edge wavelength. The light absorption edge wavelength is converted to the energy unit (eV) as the optical band gap.

(Process of Producing Oxynitride Film)

The process for producing the oxynitride film includes a process of addition of nitrogen to a formed oxide thin film, and a process of direct formation of oxynitride film.

In the former process, for example, nitrogen is added into oxide thin film by ion implantation. The ion species for the ion implantation include $N^+$ ions, $N^-$ ions, and $N_2^+$ ions (nitrogen molecular ions).

The inventors of the present invention have found that addition of nitrogen to an amorphous oxide semiconductor thin film increases the electric conductivity of the oxide thin film. The formed oxynitride film has a sufficient electric conductivity for use as the electrode.

Figure 3A:
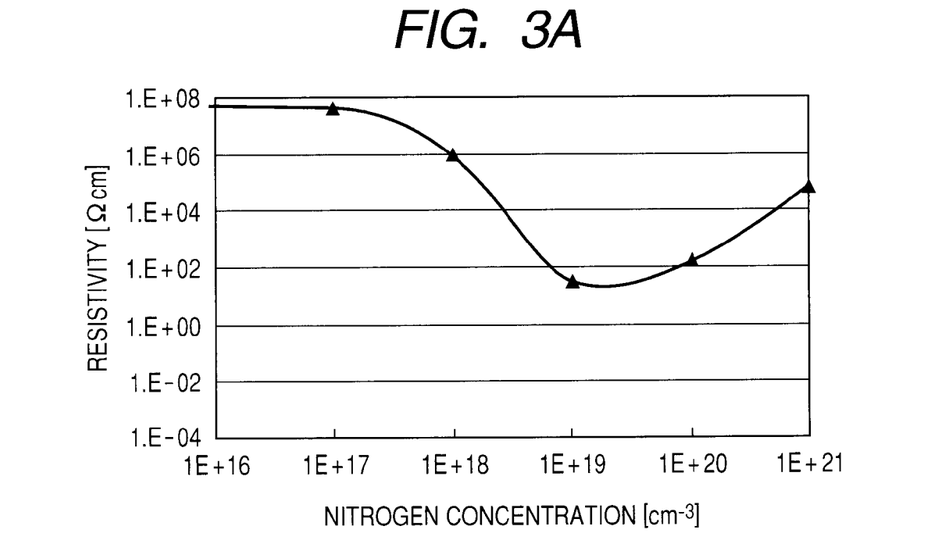
FIGS. 3A and 3B are graphs of dependence of the resistivity on a nitrogen concentration of a nitrogen-ion-containing oxide film.
Figure 3B:
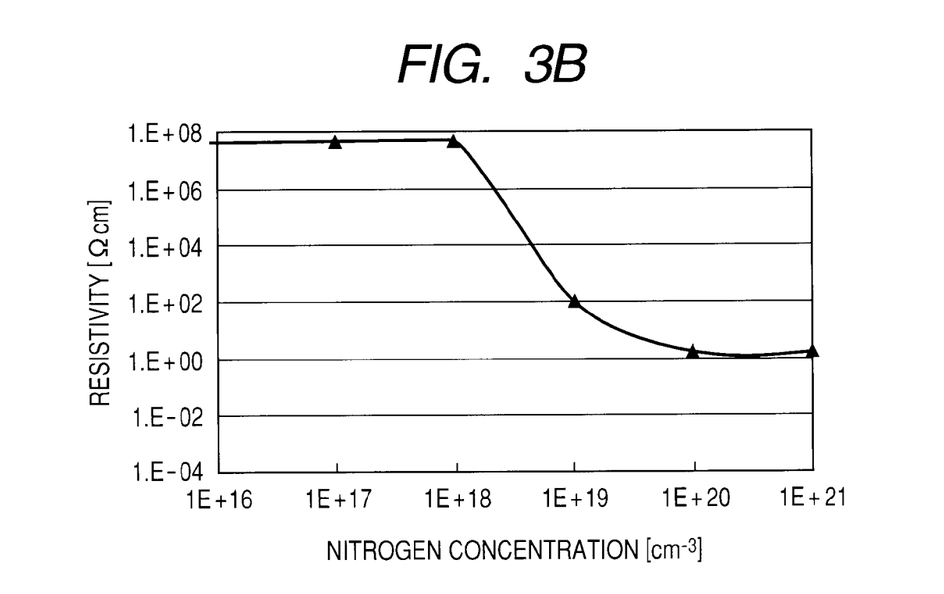

FIG. 3A shows dependency of the electric conductivity of a thin film of $InGaZnO_4$ of about 400 nm thick on the amount of nitrogen ions implanted therein. FIG. 3B shows dependency of the electric conductivity of a thin film of Zn—In—O (Zn/In compositional ratio, Zn:In=6:4) of about 400 nm thick on the amount of nitrogen ions implanted therein. The abscissa denotes the amount of implanted nitrogen ions per unit volume (nitrogen concentration), and the ordinate denotes the resistivity. The dependency of resistivity on the nitrogen concentration in the film depends on the composition of the oxide thin film, and the film properties.

For example, as shown in FIG. 3A, the film resistivity of about several tens of Ωcm can be obtained by implanting nitrogen ions into a thin film of $InGaZnO_4$ of about 1E+8 Ωcm in an amount of about $10^{19}$ ions ($1/cm^3$) in a unit volume of 1 $cm^3$ (hereinafter mentioned simply as "per volume"). Further as shown in FIG. 3B, the film resistivity of about 100 Ωcm can be obtained by implanting nitrogen ions into a Zn—In—O type thin film of about 1E+8 Ωcm in an amount of about $10^{19}$ ions ($1/cm^3$) per volume. Further, a film of a resistivity of about 10 Ωcm can be obtained by implanting nitrogen ions in an amount of about $10^{20}$ ($1/cm^3$) per volume. For use as the source electrode or the drain electrode, the concentration of the nitrogen is adjusted to be not lower than about $10^{19}$ ($1/cm^3$).

As described above, the oxynitride thin film can be formed by adding nitrogen ions into at least a part of a formed oxide thin film.

Next, another process of forming the oxynitride thin film is described in which an oxynitride thin film is formed on a substrate in a vacuum or in a controlled atmosphere.

Specifically, the process includes a method of film formation by use of an oxynitride as a source material, a method of film formation by use of an oxide as a source material in a nitrogen atmosphere, and a method of film formation by use of a nitride as a source material in an oxygen atmosphere. Otherwise, the oxynitride thin film can be produced by use of a metal source in an atmosphere of oxygen, nitrogen, or a mixture thereof. For example, an In—Ga—Zn—O—N film can be formed by sputtering simultaneously with three targets of $In_2O_3$, ZnO, and GaN; or sputtering with a target of $InGaZnO_4$ in a nitrogen-containing atmosphere. Otherwise, Zn—In—O—N film can be formed by simultaneous sputtering with targets of $In_2O_3$ and ZnO in a nitrogen-containing atmosphere. By this method, a Zn—In—O—N film can be formed which has a low resistivity of $10^{-3}$ order (unit: Ωcm): for example, the film having a resistivity ranging from 1 mΩcm ($1\times10^3$ Ωcm) to 10 mΩcm. These films have a resistivity suitable for use as the electrode.

In the above description, the film is formed by sputtering. Otherwise, another kinds of gas phase methods are applicable such as pulse laser vapor deposition (PLD method), and electron beam vapor deposition. For increasing the nitrogen concentration in the film, irradiation of N radicals by use of a radical source during the film formation is effective. The process of the film formation is not limited thereto.

If necessary, a conductive film may be formed additionally on the oxynitride electrode, whereby the electric contact between the semiconductor and the oxynitride electrode is improved and the series resistance in the electrode can be lowered.

(Channel Layer)

The channel layer may be formed from any oxide without limitation. For a higher mobility, In or Zn type oxides are preferred, including amorphous oxides of an In—Ga—Zn—O type, a Zn—In—O type, and a Zn—Sn—O type; and crystalline oxides such as ZnO, and $In_2O_3$. In particular, the channel layer is preferably formed from an amorphous oxide. A polycrystalline thin film of ZnO or the like is not preferred since it can vary TFT device characteristics owing to variation of the shape of the polycrystalline particles and of their interconnection, depending on the film formation process. Particularly, the amorphous oxide containing In, Ga, and Zn is preferred. That is, In—Ga—Zn—O films and Zn—In—O films are preferred. The electric conductivity of the amorphous oxide can be controlled by adjusting film formation conditions (the atmosphere, the temperature, and the film formation rate in the film formation), the annealing conditions, and so forth. Thereby, an amorphous oxide semiconductor having an electrical conductivity of less than 0.1 S/cm can be used for the channel. The oxide of the channel may contain nitrogen insofar as it has sufficient semiconductor characteristics.

(Gate Electrode)

Gate electrode 15 may be a transparent conductive film of $In_2O_3$:Sn, ZnO, or a like material, or a metal film of Au, Pt, Al, Ni, or the like. Otherwise the gate electrode may be a film of an oxynitride similarly as the aforementioned source electrode or drain electrode.

(Gate Insulation Layer)

Gate insulating layer 12 may be formed from any material which has a sufficient insulating property without limitation. For example, gate-insulating film 12 may be formed from $SiO_2$, $Al_2O_3$, $Y_2O_3$, or $HfO_2$, or a mixed crystalline compound containing two or more of the compounds. Thereby the leakage current between the source electrode and the gate electrode or between the drain electrode and the gate electrode can be kept to be less than about $10^{-10}$ A.

(Substrate)

Substrate 10 may be a glass substrate, a plastic substrate, a plastic film, and the like.

(TFT Characteristics)

Figure 5A:
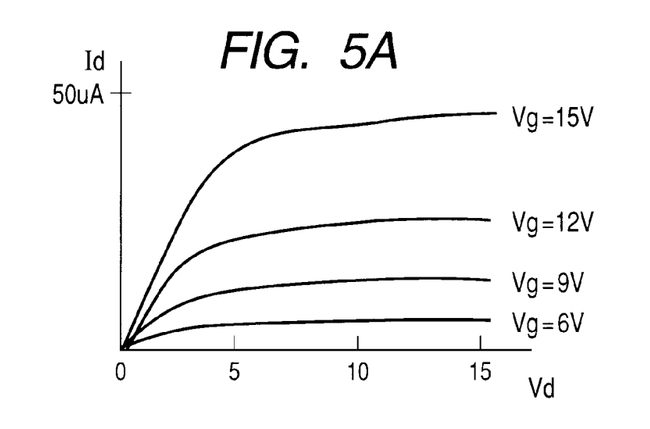
FIGS. 5A and 5B are graphs showing transistor characteristics of a thin film transistor of the present invention.
Figure 5B:
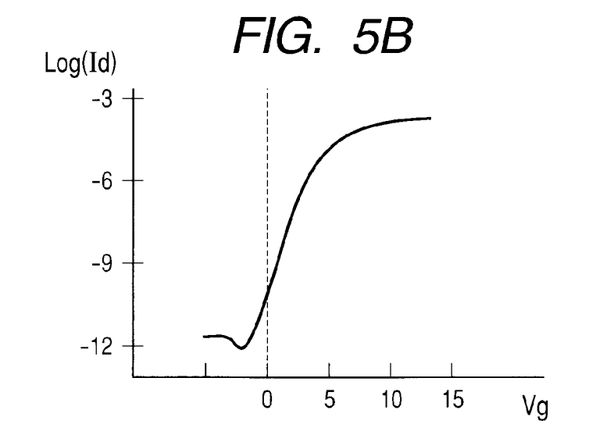

FIGS. 5A and 5B show the typical characteristics of a field effect transistor of the present invention. With application of a voltage Vd of about 5-15 V between the source electrode and the drain electrode, the current Id between the source electrode and the drain electrode can be controlled (turned on or off) by the gate voltage Vg between 0 V and 10 V. FIG. 5A shows Id-Vd characteristics with Vg changed. FIG. 5B shows the Id-Vg characteristics (transfer characteristics) at Vd of 10 V. The TFT characteristics can be evaluated by the on/off ratio and the field effect mobility. The on/off ratio is estimated from the ratio of Id at the Vg turned on to the Id at the Vg turned off. The field effect mobility can be estimated from the gradient of a graph of √Id-Vg.

EXAMPLE 1

FIG. 1A illustrates a top-gate type TFT of this Example. Channel layer 11 is a film of an amorphous oxide semiconductor of In—Ga—Zn—O type. Source electrode 13 and drain electrode 14 are films of an oxynitride of an In—Ga—Zn—O—N type. A process for producing such a TFT is described below.

Firstly, an amorphous oxide semiconductor layer is formed as channel layer 11 on glass substrate 10 (made by Corning Co.: 1737). In this Example, the amorphous oxide film of an In—Ga—Zn—O type is formed by radio frequency sputtering method in an atmosphere of an argon-oxygen gas mixture. The sputtering is conducted by use of, as the target (material source), a polycrystalline sintered compact of $InGaZnO_4$ in a size of 2 inches with the RF power input of 100 W, in an atmosphere of a gas mixture of Ar:$O_2$ (flow rate ratio of 100:1) at a total gas pressure of 0.45 Pa at the substrate temperature of 25° C. The film deposition rate is 12 nm/min. After forming the film, the annealing is carried out at 280° C. for 40 minutes. The film has a thickness of about 30 nm. According to fluorescent X-ray analysis, the metal compositional ratio In:Ga:Zn of the thin film is 35:35:30. The thin film has no distinct peak in the X-ray diffraction pattern, which shows that the thin film is amorphous.

Next, drain electrode 14 and source electrode 13 constituted of an oxynitride are formed. The electrode pattern is formed by photolithography and a lift-off method. The source electrode and the drain electrode are constituted of an In—Ga—Zn—O—N film, having a thickness of 100 nm.

Figure 6:
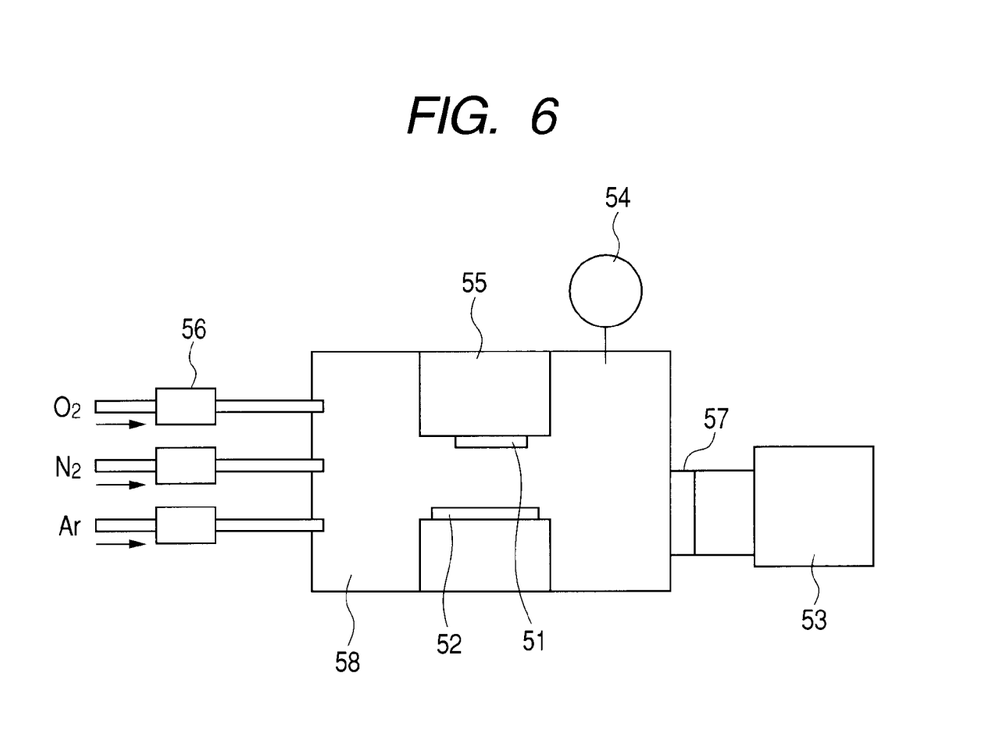
FIG. 6 illustrates schematically a sputtering apparatus for production of an oxynitride thin film.

The oxynitride film is formed by a film-forming sputtering system as illustrated in FIG. 6. In FIG. 6, the reference numerals denotes the followings: 51, a sample; 52, a target; 53, a vacuum pump; 54, a vacuum gage; 55, a substrate holder; 56, a gas flow rate controller of the respective gas feeding lines; 57, a pressure controller; 58, a film formation chamber.

Vacuum pump 53 evacuates film formation chamber 58. Substrate holder 55 holds the substrate in the film formation chamber. Target 52 is a solid material source placed in opposition to substrate holder 55. The sputtering system has further an energy source (a radio frequency source, not shown in the drawing) for evaporating the material from the solid material source, and gas-feeding lines for feeding the gases to the film formation chamber. In the drawing, two lines are provided for feeding argon and nitrogen. A prescribed gas atmosphere in the film formation chamber is prepared by controlling the flow rates of the gases separately by the gas flow rate controllers 56 and by controlling the evacuation rate by pressure controller 57.

The In—Ga—Zn—O—N film is formed by use of a target of $InGaZnO_4$, at the total pressure of 0.4 Pa, and at the Ar:$N_2$ gas flow rate ratio of 10:1. The metal compositional ratio, In:Ga:Zn, in the film is 35:36:29, and the N/O ratio in the film is 0.1. The resistivity of the film is estimated to be about 0.1 Ωcm. The thin film has no distinct peak in X-ray diffraction pattern, which shows that the thin film is amorphous.

Thereon, gate-insulating layer 12 is formed. A $SiO_x$ film is formed as gate-insulating layer 12 by sputtering in a thickness of 150 nm. The $SiO_x$ film has a dielectric constant of about 3.7

Further, gate electrode 15 of Mo is formed on the gate-insulating layer in a thickness of 100 nm. The channel of this thin film transistor has a length of 50 μm, and a width of 200 μm.

(Evaluation of Characteristics)

The results of the electrical evaluation of the TFT characteristics, show that the threshold voltage is about +1.5 V, the on/off ratio is $10^9$, and the field effect mobility is about 8 $cm^2(Vs)^{-1}$. The contact resistance between the oxynitride electrode and the oxide semiconductor is estimated to be about $2 \times 10^4$ Ωcm² to give a satisfactory ohmic contact. The ohmic contact herein signifies a contact by which the current-voltage relation is linear or nearly linear. The variation of contact resistance among the devices on a substrate is sufficiently small. The variation of the TFT characteristics between these devices is less. As described above, the source electrode and drain electrode constituted of an oxynitride of an In—Ga—Zn—O—N type gives excellent transistor characteristics.

The amorphous oxide InGaZnO$_4$ constituting the channel has an optical band gap of 2.9 eV, whereas the oxynitride film has an optical band gap of 2.6 eV.

Thus, the In—Ga—Zn—O—N film (oxynitride film) absorbs effectively a near-ultraviolet light (wavelength of 450 nm or shorter) which can affect the channel. Therefore, use of the oxynitride film as the electrode intercepts penetration of near-ultraviolet light through the electrode to the channel, which enables formation of a TFT substrate (TFT array) stable to the light.

The field effect transistor having characteristics stable to light exposure is promising for applications such as to an operation circuit of an organic light emission diode.

EXAMPLE 2

FIG. 1B illustrates a bottom-gate type TFT of this Example. Channel layer 11 is a film of an amorphous oxide of Zn—In—O type. Source electrode 13 and drain electrode 14 are films of an oxynitride of a Zn—In—O—N type. A process for producing such a TFT is described below.

Firstly, a Mo film is formed in a thickness of 100 nm as the gate electrode on a glass substrate (made by Corning Co.: 1737) by sputtering.

Then a SiO$_x$ film is formed as gate electrode-insulating layer 12 in a thickness of 150 nm by sputtering.

Thereafter an amorphous oxide semiconductor film of a Zn—In—O type is formed as the channel layer by simultaneous sputtering by use of a ZnO target and an In$_2$O$_3$ target. In the sputtering, the mixing ratio of argon and oxygen is Ar:O$_2$=80:1, film formation rate is 12 nm/min, the substrate temperature is 25° C., and the film thickness is about 30 nm. The formed Zn—In—O film is amorphous. The metal compositional ratio of Zn:In is 64:36. The thin film has no distinct peak in X-ray diffraction pattern, which shows that the thin film is amorphous.

Thereon, drain electrode 14 and source electrode 13 constituted of an oxynitride are formed. The electrodes are Zn—In—O—N films of 150 nm thick. The Zn—In—O—N film is formed by simultaneous sputtering by use of targets of ZnO and In at a total pressure of 0.4 Pa and a gas flow rate ratio of Ar:N$_2$ of 1:1 in the film formation process. The radical source is employed to excite the nitrogen gas by electron cyclotron resonance plasma. The metal compositional ratio of Zn:In is 61:39, and compositional ratio of N:O is about 6:4 in the film. The film has a resistivity of about 10 mΩcm which is sufficiently low for use as the electrode. The oxynitride thin film of this Example is constituted of a polycrystalline film according to evaluation by X-ray diffraction, which gives presumably the low resistivity.

(Evaluation of Characteristics)

The results of the evaluation of the TFT characteristics show that the threshold voltage is about 0.5 V, the on/off ratio is 10$^9$, and the field effect mobility is about 16 cm$^2$(Vs)$^{-1}$. The contact resistance between the oxynitride electrode and the oxide semiconductor is estimated to be about 1×10$^{-4}$ Ωcm$^9$ to give in a satisfactory ohmic contact. The variation of the contact resistance among the devices of the substrate is small, whereby the variation of the TFT characteristics between devices is less.

As described above, the use of the source electrode and drain electrode constituted of an oxynitride of a Zn—In—O—N type and an amorphous Zn—In—O semiconductor gives excellent transistor characteristics.

The amorphous oxide of the Zn—In—O type constituting the channel has an optical band gap of 2.6 eV, whereas the oxynitride film (Zn—In—O—N film) has an optical band gap of 1.6 eV. Thus, the Zn—In—O—N film absorbs effectively a near-ultraviolet light which can affect the channel. Therefore, use of the oxynitride film as the electrode intercepts the penetration of near-ultraviolet light through the electrode to the channel, which enables formation of a TFT substrate stable to the light.

The field effect transistor having characteristics stable to light exposure is promising for applications such as to an operation circuit of an organic light emission diode.

EXAMPLE 3

Figure 7A:
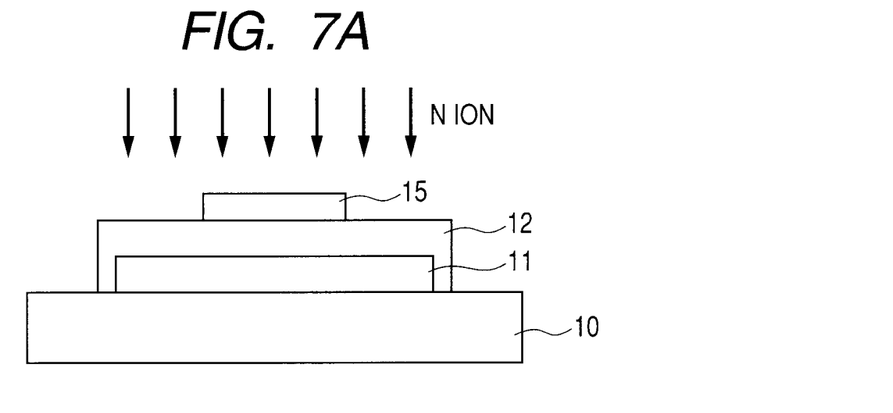
FIGS. 7A, 7B, and 7C illustrate a process for producing a coplanar type thin film transistor of the present invention.
Figure 7B:
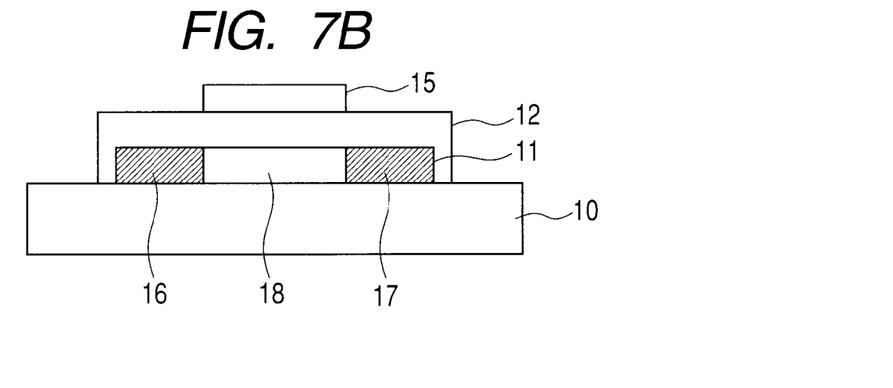
Figure 7C:
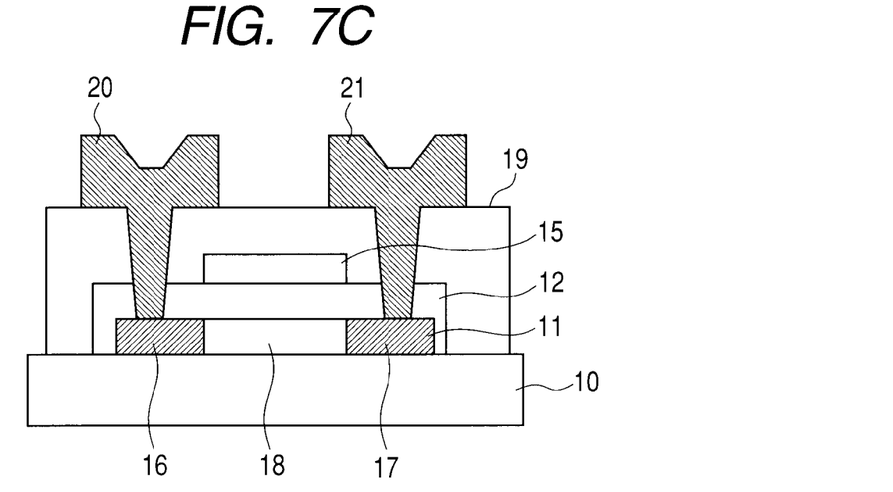

FIG. 2 illustrates a coplanar type of the field effect transistor of this Example. FIG. 2 is a sectional view, in which the reference numerals denote the followings: 10, a substrate; 11, a channel layer (oxide thin film); 12, a gate insulating layer; and 15, a gate electrode. Channel layer 11 has three regions: source region 16 containing implanted nitrogen (corresponding to the source electrode in Example 1), drain region 17 containing implanted nitrogen (corresponding to the drain electrode in Example 1), and channel region 18 (corresponding to the channel layer in Example 1). Channel layer 11 is formed from In—Ga—Zn—O type amorphous oxide, and source region 16 and drain region 17 as the electrodes are formed therein by nitrogen ion implantation. FIGS. 7A, 7B, and 7C illustrate a process of formation of the source region and the drain region. The steps of formation of such a transistor are described below.

Firstly, an amorphous oxide layer is formed as channel layer 11 on glass substrate 10 (made by Corning Co.: 1737). In this Example, the amorphous oxide film of an In—Zn—Ga—O type is formed by radio frequency sputtering in an atmosphere of an argon-oxygen gas mixture. The sputtering is conducted with a target (material source) constituted of a polycrystalline sintered compact of InGaZnO$_4$ in a size of 2 inches with the RF power input of 100 W in an atmosphere of a gas mixture of Ar:O$_2$ (flow rate ratio of 80:1) at a total gas pressure of 0.45 Pa at the substrate temperature of 25° C. The film formation rate is 11 nm/min. The film has a thickness of about 50 nm. According to fluorescent X-ray analysis, the metal compositional ratio In:Ga:Zn of the thin film is 36:35:29. The thin film has no distinct peak in the X-ray diffraction pattern, which shows that the formed thin film is amorphous.

Next, gate-insulating layer 12 is formed and patterned. A SiO$_x$ film is formed as gate-insulating film 12 by sputtering in a thickness of 150 nm. Thereon, gate electrode 15 composed of Mo is formed in a thickness of 100 nm. Then, nitrogen ions are implanted into amorphous oxide thin film 11 (FIG. 7A) to form source region 16 and drain region 17 in the channel layer (11) (FIG. 7B). In this ion implantation, the nitrogen ions are implanted through gate-insulating layer 12 into channel layer (oxide thin film) 11 as illustrated in FIG. 7A. In the above steps, gate electrode 15 serves as the mask, and the nitrogen-implanted source region 16 and nitrogen-implanted drain region 17 are placed by self-aligning according to the pattern of the gate electrode. The ion implantation is conducted by employing N$^+$ as the ion species at an acceleration voltage of 30 kV. The nitrogen concentration in source region 16 and drain region 17 is about 2×10$^{19}$ (1/cm$^3$). Another sample to which nitrogen have been implanted under the same conditions as above has a resistivity of about 10 Ωcm. Further, as illustrated in FIG. 7C, insulating layer 19 constituted of SiO$_2$ and wirings 20, 21 constituted of Mo are formed. Finally the product is annealed at 300° C. for 20 minutes. Channel region 18 has a length of 40 μm and a width of 200 μm. The wirings are composed of Mo and has a thickness of 100 nm.

(Evaluation of TFT Characteristics)

The TFT shows characteristics of the threshold voltage of about 1 V, the on/off ratio of $10^9$, and the field effect mobility of about 9 $cm^2(Vs)^{-1}$. The contact resistance between the oxynitride electrode and the oxide semiconductor is estimated to be about $8\times10^{-5}$ $\Omega cm^2$ to give a satisfactory ohmic contact. The variation of the contact resistance among the devices on the substrate is small, whereby the variation of the TFT characteristics among the devices is less. The field effect transistor of this Example has, within channel layer (oxide thin film) 11, channel region 18, and source region 16 and drain region 17 containing nitrogen at a concentration higher than that in channel region 18. The addition of nitrogen to source region 16 and drain region 17 makes higher the electric conductivity than that of channel region 18. Thus by constituting source region 16 and drain region 17 from the material nearly the same as the material for channel region 18, effective electric connection of channel region 18 can be obtained with source wiring 20 and drain wiring 21. That is, wiring 20 and wiring 21 are effectively connected through source region 16 and drain region 17 to channel region 18. Thereby, the electric connection of channel region 18 with wirings 20 and 21 can be made stable to improve the uniformity and reliability of the elements.

The TFT of this Example has excellent hysteresis characteristics (causing less hysteresis). The term "hysteresis" herein signifies the phenomenon that, in sweeping (raising and lowering) the gate voltage Vg with the fixed voltage Vd between the source electrode and drain electrode, the transition of the current Id between the electrodes during the increase of gate voltage Vg is different from that during the decrease thereof. A larger hysteresis causes larger deviation of the Id from the set Vg. Therefore, the smaller hysteresis of the element is preferred. According to this Example, excellent electric connection can be achieved in which the charge is less liable to be trapped to give a smaller hysteresis of the thin film transistor.

The TFT of this Example has excellent dynamic characteristics (pulse response). For evaluation of the dynamic characteristics, with a voltage of 5 V applied between the source electrode and the drain electrode, a voltage of +5 V and a voltage of −5 V are applied alternately to the gate electrode at a pulse width of 30 μsec and a period of 30 msec, the rise of the current is excellent and variation of the rising time varies less between the elements. In this Example, by employing a self-aligning technique, the overlap of the source region with the gate electrode and the overlap of the drain electrode with the gate electrode are small, and the overlaps are uniform. As the result, the parasitic capacitances which are caused in the overlap parts of the source region with the gate electrode and the drain region with the gate electrode are small and uniform among the devices. The small parasitic capacitance enables high-speed operation, and the uniform parasitic capacitances give a transistor with high uniformity of the characteristics. In other words, this Example enables formation of the gate electrode, the source region, and the drain region with high positional precision by a self-aligning technique for high-speed operation with high uniformity of the elements.

The inventors of the present invention disclose a technique of forming a source region by implanting hydrogen or heavy hydrogen for excellent electric connection in Japanese Patent Application Laid-Open No. 2007-250983. However, the TFT constitution having a hydrogen-implanted electrode region (source region) tends to cause variation of the TFT characteristics in a heat treatment step, for example, at a temperature higher than about 350° C. This is considered to be caused by diffusion of the hydrogen in the oxide semiconductor, although the reason is not verified. In contrast, the constitution containing a nitrogen-implanted electrode region (source region) of the present invention will not cause variation of the TFT characteristics in the heat treatment. Owing to slower diffusion of the nitrogen in the oxide semiconductor, the electric connection which is less affected by the temperature can be achieved. The field effect transistor of the present invention in which the connection of the oxide semiconductor with the electrode is satisfactory is promising for an operation circuit of an organic light-emitting diode, and the like application field.

EXAMPLE 4

FIG. 1B illustrates a bottom-gate type TFT of this Example. Channel layer 11 is a crystalline oxide semiconductor constituted of ZnO. Source electrode 13 and drain electrode 14 are constituted of a crystalline oxynitride of a Zn—In—O—N type. Gate electrode 15 is also constituted of an oxynitride film.

Firstly, a Zn—In—O—N film is formed in a thickness of 100 nm as gate electrode 15 on glass substrate 10 (made by Corning Co.: 1737) by sputtering. The film formation is conducted in the same manner as formation of the Zn—In—O—N film in Example 2.

Then, a $SiO_x$ film is formed as gate electrode-insulating layer 12 in a thickness of 150 nm by sputtering.

Thereafter, a polycrystalline ZnO film is formed as channel layer 11 by sputtering with a ZnO sintered compact as the target at an argon-oxygen mixing ratio of $Ar:O_2=10:1$ at a film formation rate of 12 nm/min at a substrate temperature of 25° C. The formed film has a thickness of about 30 nm. The ZnO film constituting the channel layer of this Example is a polycrystalline film having a wurtzite structure.

Thereon, drain electrode 14 and source electrode 13 constituted of an oxynitride are formed. The electrodes are Zn—In—O—N films of 150 nm thick. The Zn—In—O—N film is formed by simultaneous sputtering by use of targets of ZnO and In at a total pressure of 0.3 Pa and a gas flow rate ratio of $Ar:N_2=1:1$ during the film formation process. The nitrogen gas as the radical source employed is excited by electron cyclotron resonance plasma. The metal compositional ratio of Zn:In is about 1:1, and compositional ratio of N:O is also about 1:1. The film has a resistivity of about 3 mΩcm which is sufficiently low for use as the electrode. The oxynitride thin film of this Example is constituted of a polycrystalline film according to evaluation by X-ray diffraction.

(Property Evaluation)

From the evaluation of the TFT characteristics, the threshold voltage is about 0.5 V, the on/off ratio is $10^7$, and the field effect mobility is about 4 $cm^2(Vs)^{-1}$. The contact resistance between the oxynitride electrode and the oxide semiconductor is estimated to be about $1\times10^{-4}$ $\Omega cm^2$ to give a satisfactory electric connection. As described above, the use of the source electrode and drain electrode constituted of an oxynitride of a Zn—In—O—N type and an amorphous Zn—In—O semiconductor gives excellent transistor characteristics.

The oxynitride film (Zn—In—O—N) has an optical band gap of about 1.5 eV, whereas the ZnO constituting the channel has an optical band gap of about 3.3 eV. Thus, the Zn—In—O—N film absorbs effectively a near-ultraviolet light which can affect the channel. Therefore, use of the oxynitride film as the electrode intercepts penetration of near-ultraviolet light through the electrode to the channel, which enables formation of a TFT substrate stable to the light.

The field effect transistor having characteristics stable to light exposure is promising in applications such as to an operation circuit of an organic light emission diode.

The thin film transistor employing the oxide semiconductor of the present invention can be produced by formation of the thin film at a lower temperature, and is stable under irradiation of light. Therefore this thin film transistor is useful as a switching element of an LCD and an organic EL display, a flexible display, a see-through type display, an IC card, an ID tag, and so forth widely.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-261878, filed Oct. 8, 2008, which is hereby incorporated by reference herein in its entirety.

What is claimed is:

1. A field effect transistor having a gate electrode, a gate-insulating layer, a channel and source and drain electrodes connected electrically to the channel, the channel comprising an amorphous oxide semiconductor containing Zn or In, and the source electrode or the drain electrode comprising an oxynitride containing Zn or In and having an optical band gap to absorb near-ultraviolet light.

2. The field effect transistor according to claim 1, wherein the metallic element contained in the amorphous oxide semiconductor and the metallic element contained in the oxynitride are the same.

3. The field effect transistor according to claim 2, wherein the amorphous oxide semiconductor contains Zn, In and O, and the oxynitride contains a crystal which contains Zn, In, O and N.

4. The field effect transistor according to claim 1, wherein the compositional ratio of oxygen and nitrogen contained in the oxynitride is represented by the relational expression (1):

$$\text{(Nitrogen atoms)}/\text{(Nitrogen atoms+Oxygen atoms)} \geq 0.01 \qquad (1).$$

5. The field effect transistor according to claim 1, wherein an optical band gap of the oxynitride is smaller than an optical band gap of the amorphous oxide semiconductor.

6. The field effect transistor according to claim 1, wherein the source electrode and the drain electrode are a source region and a drain region formed by addition of nitrogen to the amorphous oxide semiconductor constituting the channel.

* * * * *